United States Patent

Hanners

[11] Patent Number: 6,128,188
[45] Date of Patent: Oct. 3, 2000

[54] SELF-BALANCING THERMAL CONTROL DEVICE FOR INTEGRATED CIRCUITS

[75] Inventor: John C. Hanners, Brentwood, Calif.

[73] Assignee: Credence Systems Corporation, Fremont, Calif.

[21] Appl. No.: 09/437,376

[22] Filed: Nov. 10, 1999

Related U.S. Application Data

[62] Division of application No. 09/016,576, Jan. 30, 1998, Pat. No. 6,016,250.
[51] Int. Cl.⁷ ...................................................... H05K 7/20
[52] U.S. Cl. .......................... 361/694; 165/80.3; 174/16.3; 361/719
[58] Field of Search ...................................... 361/687, 690, 361/694, 695, 697, 702, 704, 722, 717–719, 699, 700; 454/184; 257/713, 714, 722; 174/16.3; 165/80.3, 185, 121–126

[56] References Cited

U.S. PATENT DOCUMENTS

| | | |
|---|---|---|
| 3,586,915 | 6/1971 | Urquhart . |
| 3,807,489 | 4/1974 | Minbiole et al. . |
| 4,246,786 | 1/1981 | Wiemer et al. . |
| 4,740,138 | 4/1988 | Zaehring et al. . |
| 5,463,529 | 10/1995 | Chia et al. . |
| 5,773,755 | 6/1998 | Iwatare . |
| 6,016,250 | 1/2000 | Hanners . |

FOREIGN PATENT DOCUMENTS 6-163758  6/1994  Japan .

*Primary Examiner*—Gerald Tolin
*Attorney, Agent, or Firm*—Daniel J. Bedell; Smith-Hill and Bedell

[57] ABSTRACT

A self-balancing temperature control device for an integrated circuit (IC) includes a heat sink attached to the IC having thermomorphic fins or vanes. When the IC increases its heat output, the fins or vanes warm up and change their shape in a manner that increases the rate at which heat is removed from the IC.

8 Claims, 4 Drawing Sheets

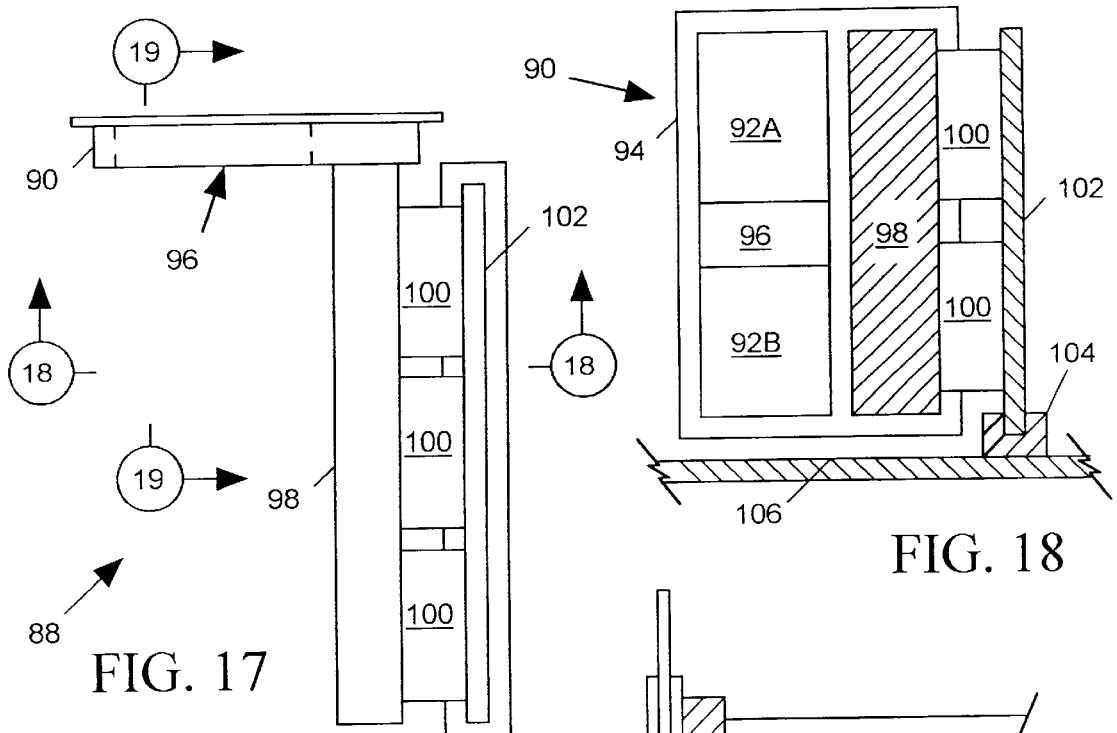
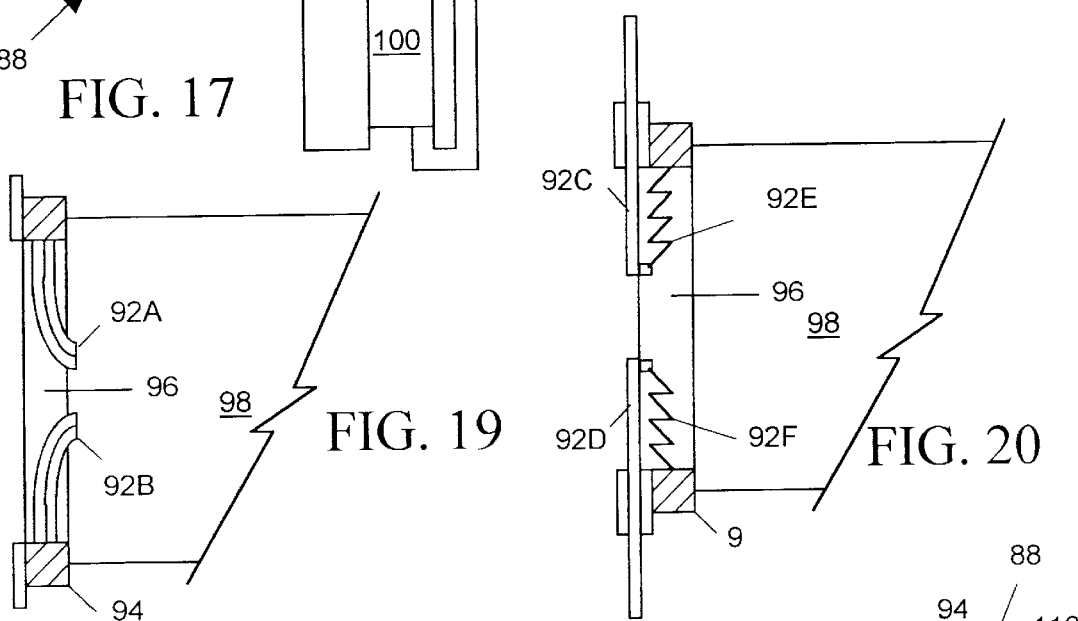
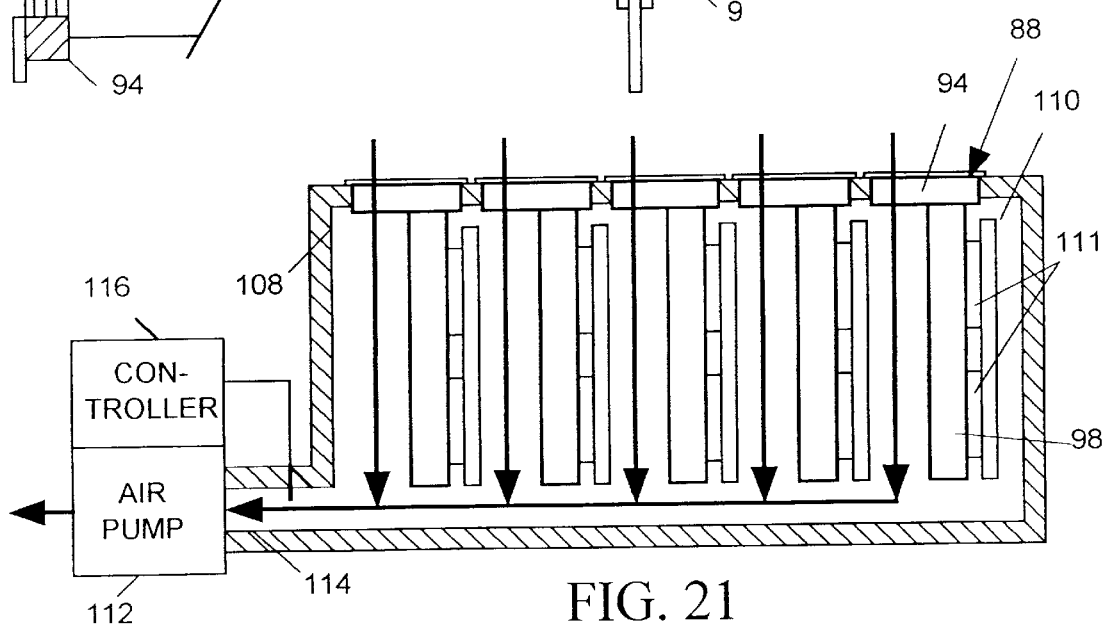

SELF-BALANCING THERMAL CONTROL DEVICE FOR INTEGRATED CIRCUITS

The present application is a divisional application of Ser. No. 09/016,576, now U.S. Pat. No. 6,016,250, filed Jan. 30, 1998 and issued Feb. 1, 2000.

BACKGROUND OF THE INVENTION

1. Field of the Invention

The present invention relates in general to thermal control devices for integrated circuits (ICs) and in particular to a self-balance thermal control device for ICs.

2. Description of Related Art

An integrated circuit (IC) generates heat. That heat has to be removed from the IC because an IC that is too hot will not operate properly. Heat escapes from an IC through some combination of radiation, conduction and convection. An IC typically loses most of its heat by conduction into objects it contacts or by convection through the surrounding air. A metallic heat sink is attached to an IC to increase the rate at which heat is carried away from the IC by conduction. A heat sink, which normally transfers the heat it acquires from the IC to the surrounding air, typically includes fins to increase its surface area, thereby increasing the rate at which it transfers heat into the air. When fans force ambient air past the heat sink fins, they increase the rate at which the heat sink is able remove heat from the IC. The heat transfer rate can be further increased by forcing chilled air past the heat sink fins.

While it is important to keep an IC sufficiently cool, in some applications it is also important to keep an IC sufficiently warm. For example the speed with which transistors within a digital IC switch on and off is influenced by the IC's temperature. Typically the cooler the IC, the faster the transistors switch. In applications where IC transistor switching speed must be tightly controlled, it is helpful to keep the IC within a limited temperature range so that switching speed is neither too fast nor too slow. If an IC generates a constant, predictable amount of heat and if the temperature and flow rate of the air around it are constant and predictable, then a properly sized heat sink could hold the IC at a desired temperature. However the amount of heat that an IC generates can vary from time to time depending, for example, on the load the IC is driving at any given moment or on the duty cycle of its input signals. Also the temperature and flow rate of the cooling air can vary over time. Thus while a heat sink can remove heat from an IC and help keep it cool, a heat sink does not necessarily hold an IC to any particular temperature range. The more heat the IC generates, the hotter it gets.

Temperature control systems employing feedback have been used to keep an IC within a limited temperature range. Such systems sense the temperature of an IC in some manner and then either control the rate at which the IC produces heat or the rate at which heat is carried away from the IC so as to keep the sensed temperature within the desired range. IC temperature is typically sensed by a sensing device either attached to the IC, mounted near the IC, or formed within the IC itself. The sensing device produces an output voltage or current that varies with temperature. That voltage or current is used, for example, to control the amount of heat produced by a heater attached to the IC or to control the temperature or flow rate of cooling air passing over the IC.

Such feedback methods for controlling IC temperature can work quite well but they can be expensive. What is needed is an inexpensive system for controlling operating temperature range of an IC.

SUMMARY OF THE INVENTION

In accordance with one embodiment of the present invention the rate at which heat is removed from an IC is controlled by a fin on a heat sink attached to the IC. The fin is made of thermomorphic material that changes shape when heated. When the IC temperature increases, the heat sink transfers heat at a higher rate from the IC to the fin, thereby increasing fin temperature. As the fin warms, it changes its shape thereby increasing its surface area and, therefore, the rate at which it dissipates heat into the surrounding air.

In accordance with another embodiment of the invention, a thermomorphic vane thermally linked to an IC through a heat sink is placed in the path of forced cooling air that removes heat from the heat sink. When the vane is cool it substantially restricts the flow of the cooling air across the heat sink so that the cooling air removes heat from the heat sink at a relatively low rate. As the IC warms the heat sink, the heat sink carries heat to the vane at a higher rate, thereby warming the vane. As the vane's temperature increases it changes its shape so as to allow increasingly more cooling air to flow across the heat sink, thereby increasing the rate at which the cooling air removes heat from heat sink.

In either embodiment of the invention the thermomorphic fins or vanes limit IC operating temperature to a range that is smaller than a conventional heat sink.

It is accordingly an object of the invention to provide a system for limiting the range of operating temperatures of an IC.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 is a plan view of a self-balancing thermal control device for an integrated circuit (IC) device in accordance with the present invention, FIG. 2 is an elevation view of the thermal control device of FIG. 1 as it appears when the IC is generating small amounts of heat, FIG. 3 is an elevation view of the thermal control device of FIG. 1 as it appears when the IC is generating large amounts of heat, FIG. 4 is a perspective view of the thermal control device of FIG. 1 as it appears when the IC is generating small amounts of heat, FIG. 5 is a perspective view of the thermal control device of FIG. 1 as it appears when the IC is generating large amounts of heat, FIG. 6 is a perspective view of a first alternative embodiment of a self-balancing thermal control device in accordance with the present invention as it appears when the IC is generating small amounts of heat, FIG. 7 is a perspective view of the thermal control device of FIG. 6 as it appears when the IC is generating large amounts of heat.

FIGS. 17–19 are plan and elevations views of the thermal control device,

FIGS. 20 and 21 are alternative embodiments of the thermal control device.

DESCRIPTION OF THE PREFERRED EMBODIMENT(S)

Figure 1:
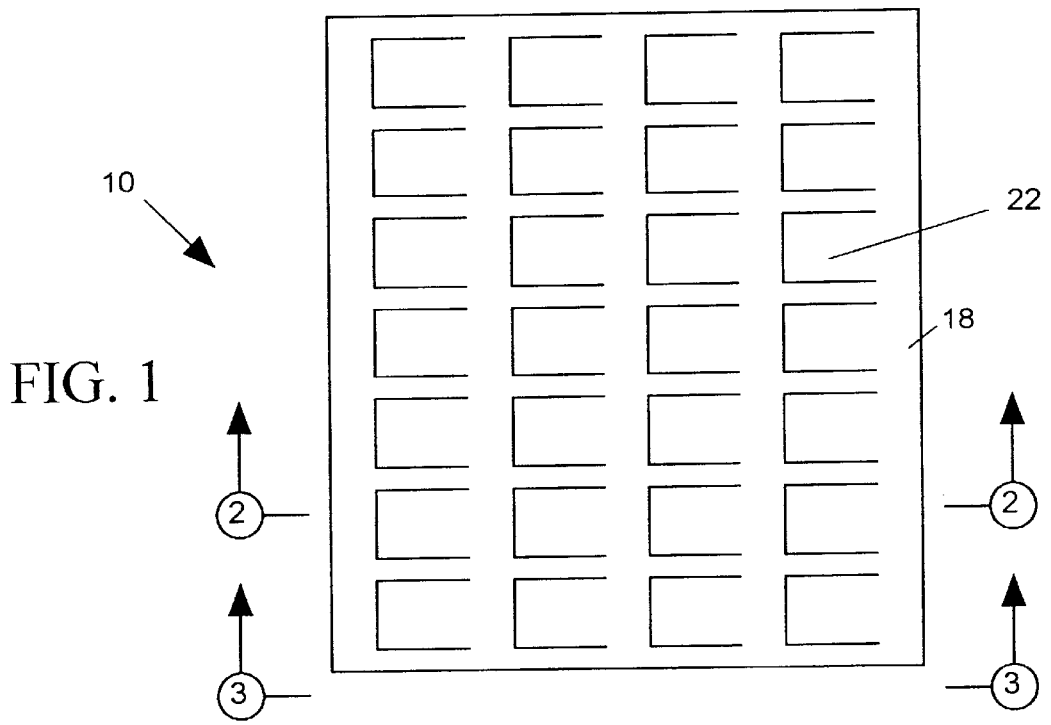

A thermal control device in accordance with the present invention attaches to an integrated circuit (IC) and includes fins or vanes made of a thermomorphic material that changes shape as the IC warms them. In the preferred embodiments of the invention the fins or vanes are made of bi-metallic material having two metallic layers with each layer having a substantially different coefficient of thermal expansion so that the material bends as it changes temperature. As they change shape, the thermomorphic fins or vanes regulate the rate at which heat is removed from the IC. In some embodiments of the present invention, as described below, the fins expose more of their surface area to the surrounding air as they warm up, thereby increasing the rate at which the fins transfer heat from the IC to the air. In other embodiments of the invention the vanes act as air valves to increase the amount of cooling air passing by the IC as they warm up, thereby increasing the rate at which the cooling air carries heat away from the IC.

Thermal Control Device with Vertical Bi-Metallic Fins

FIGS. 1–5 illustrate a thermal control device 10 in accordance with a first preferred embodiment the present invention. Thermal control device 10 attaches to an integrated circuit device (IC) 12 and operates as a heat sink to remove heat from IC 12. Thermal control device 10 includes a metallic base layer 14 covered by a bi-metallic sheet 16. Bi-metallic sheet 16 includes a metallic lower layer 18 and a metallic upper layer 20 that have been bonded together. Lower layer 18 suitably has the same coefficient of expansion as base layer 14 but upper layer 20 is formed of a material that has a lower coefficient of expansion than that of lower layer 18. An array of fins 22 have been stamped into bi-metallic sheet 16, and then all portions of upper layer 20 of bi-metallic sheet 16, except portions of layer 20 forming fins 22, have been removed from sheet 16 by etching so that only fins 22 are bi-metallic. Those portions of lower layer 18 of bi-metallic sheet 16 not included in fins 22 are bonded to base layer 14.

Figure 2:
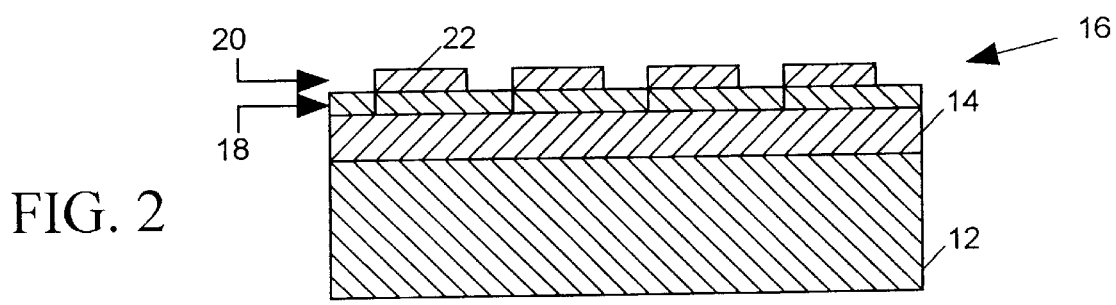
Figure 3:
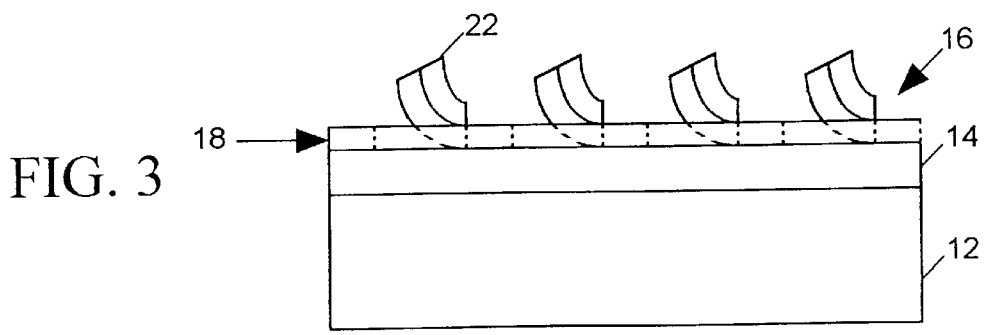
Figure 4:
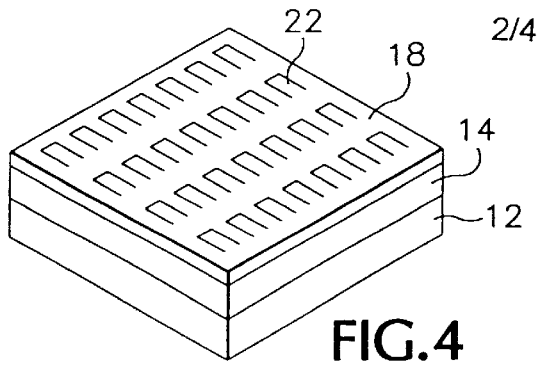
Figure 5:
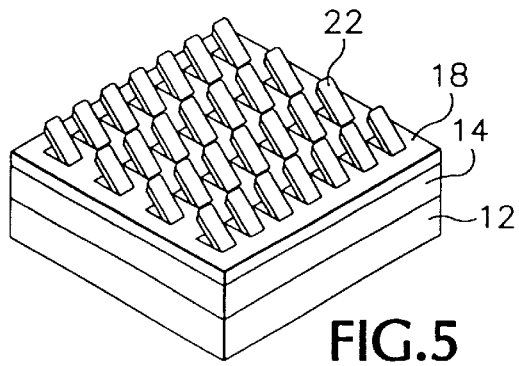

Fins 22 transfer heat from IC 12 to the surrounding air. When IC 12 is cool, as shown in FIGS. 2 and 4, fins 22 lie flat. However as fins 22 warm up they bend increasingly upward, as shown in FIGS. 3 and 5. As they bend upward, fins 22 expose more of their surface area to the surrounding air and are able to transfer heat to the air at a higher rate. By increasing its surface area when IC 12 becomes warmer, thermal control device 10 limits temperature swings in IC 12 to a narrow range than would a heat sink having fins that do not change shape with temperature.

Thermal Control Device with Horizontal Bi-Metallic Fin Assemblies

Figure 6:
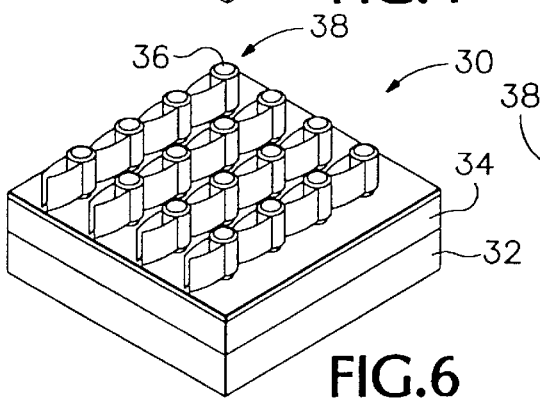
Figure 7:
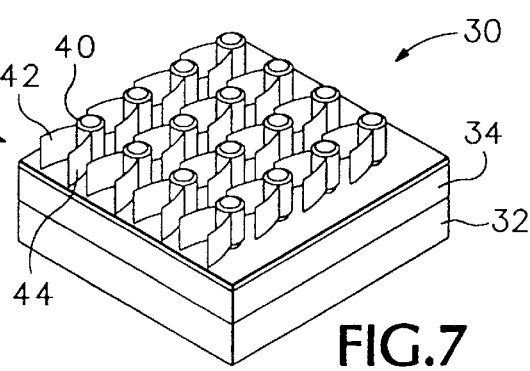
Figure 8:
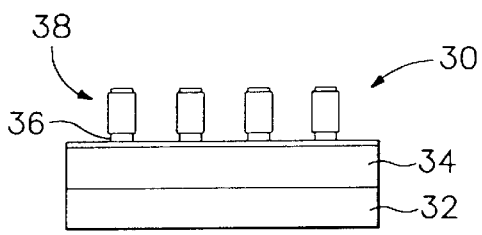
FIG. 8 is an elevation view of the thermal control device of FIG. 6.
Figure 9:
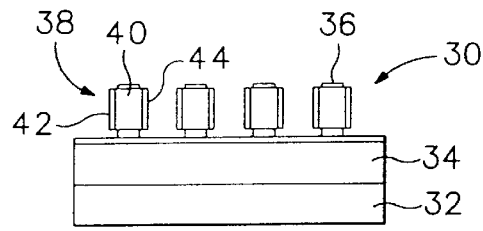
FIG. 9 is an elevation view of the thermal control device of FIG. 7.

FIGS. 6–9 illustrate a thermal control device 30 in accordance with a second embodiment of the present invention. Thermal control device 30, suitable for use as a heat sink for an IC when there is little or no movement of the surrounding air, attaches to an upper surface of an IC 32. Thermal control device 30 includes a metallic base layer 34, an array of vertical metallic heat conductors 36 attached to base layer 34, and a set of vertical fin assemblies 38, each installed on a separate one of heat conductors 36. Heat conductors 36 may, for example, be solid metal rods or heat pipes. Each fin assembly 38 includes a metal tube 40 fitting over one of heat conductors 36 and a pair of bi-metallic fins 42 and 44 attached to tube 40. Heat generated by IC 32 travels by conduction up heat conductors 36 and into fins 42 and 44. Fins 42 and 44 dissipate the heat into the surrounding air. FIGS. 6 and 8 illustrate thermal control device 30 when IC 32 is not generating much heat. Fins 42 and 44, being relatively cool bend inward toward one another and expose a minimum amount of their surface area to the surrounding air. When IC 32 generates relatively more heat, fins 42 and 44 warm up and bend away from one another, thereby exposing more of their surface area to the surrounding air and allowing heat to be conducted more rapidly away from the fins. By increasing the surface area of its fins 42 and 44 as IC 32 becomes warmer, thermal control device 30 limits temperature swings in IC 32 to a narrower range than would a conventional heat sink having fins that do not significantly change their exposed surface area with temperature.

Thermal Control Device With Air Flow Control Vanes

FIGS. 10–13 illustrate a thermal control device 50 in accordance with a third embodiment of the present invention. Thermal control device 50 is suitable for use where cooling air 51 is forced across thermal control device 50. Thermal control device 50, which attaches to an upper surface of an integrated circuit device (IC) 52, is generally similar in construction to thermal control device 30 of FIGS. 6 and 7 having a metallic base layer 54, an array of metallic heat conductors 56, and a set of vane assemblies 60 mounted on heat conductors 56. Heat conductors 56 may, for example be solid metal rods or heat pipes. Each vane assembly 58 also includes a metal tube 60 fitting over one of heat conductors 56 and a pair of bi-metallic vanes 62 and 64. Unlike fins 42 and 44 of FIGS. 6–9 which move together as they warm up, vanes 62 and 64 of FIGS. 10–13 move apart when they warm up.

Figure 10:
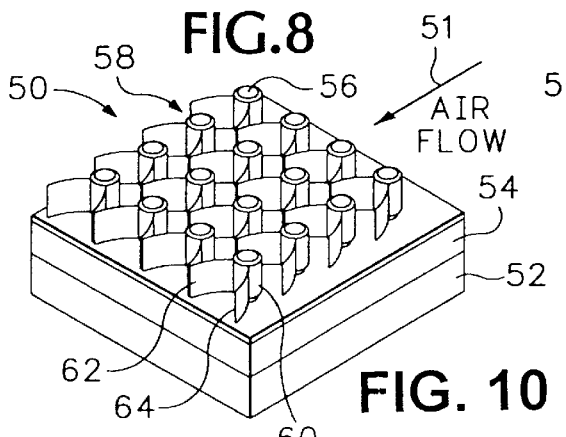
FIG. 10 is a perspective view of a second alternative embodiment of a self-adjusting thermal control device in accordance with the present invention as it appears when the IC is generating small amounts of heat.
Figure 11:
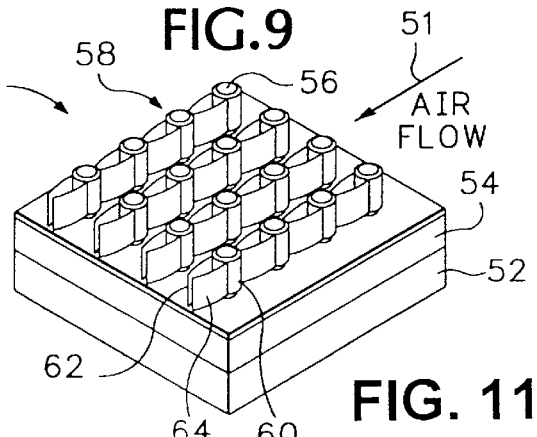
FIG. 11 is a perspective view of the thermal control device of FIG. 10 as it appears when the IC is generating large amounts of heat.
Figure 12:
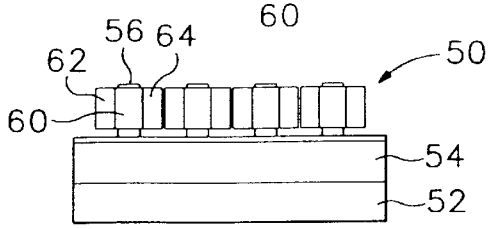
FIG. 12 is an elevation view of the thermal control device of FIG. 10.
Figure 13:
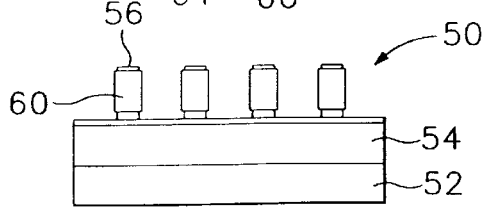
FIG. 13 is an elevation view of the thermal control device of FIG. 11.

When IC 52 is not generating much heat vanes 62 and 64 of each vane assembly 58 move apart as illustrated in FIGS. 10 and 12 so as to block the flow of cooling air 51 between vane assemblies 58. This limits the rate at which vanes 62 and 64 can transfer heat into the surrounding air. As IC 52 begins to generate more heat, that heat warms vanes 62 and 64 causing them to move closer together as illustrated in FIGS. 11 and 13. This allows more cooling air 51 to pass by vanes 62 and 64 thereby to remove heat from vanes 62 and 64, heat conductors 56 and base layer 34 at a faster rate. Thus vanes 62 and 64 operate as air valves to control the flow of cooling air 51 through thermal control device 50 and therefore the rate at which heat is removed from IC 52. The "air-foil" shape of vanes 62 and 64 help to reduce air turbulence, thereby improving the efficiency of heat transfer from vanes 62 and 64 into cooling air 51.

Figure 14:
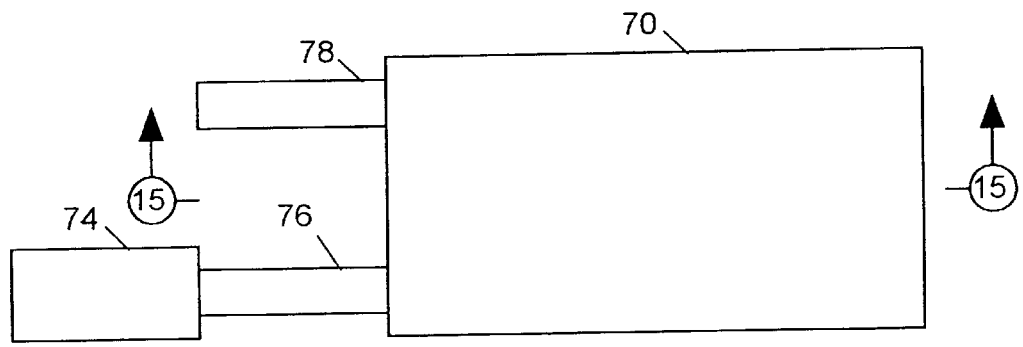
FIG. 14 illustrates a plan view of temperature control system for ICs mounted on a set of circuit boards.
Figure 15:
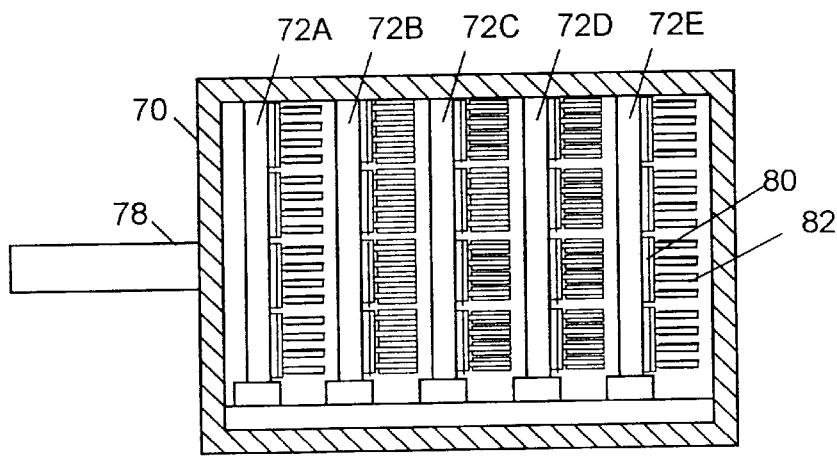
FIG. 15 illustrates a sectional elevation view of the temperature control system of FIG. 14.
Figure 16:
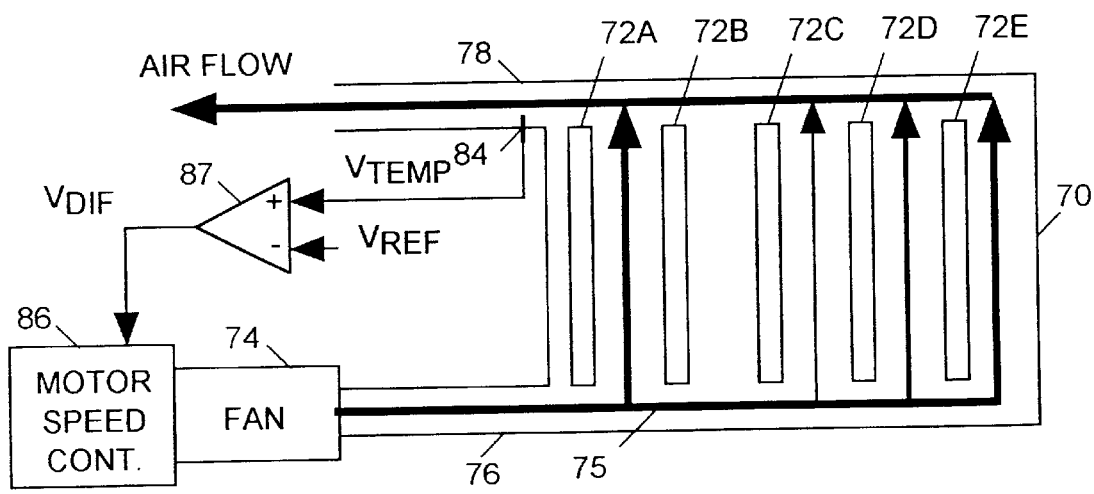
FIG. 16 is a schematic diagram of the temperature control system of FIG. 14.

FIG. 14 illustrates a plan view and FIG. 15 illustrates a sectional elevation view of a chassis 70 for holding a set of five integrated circuit cards 72A–72E. FIG. 16 is a schematic diagram showing air flow through chassis 70. A fan 74 forces cooling air 75 into chassis 70 via an inlet port 76. The cooling air 75 passes between circuit cards 72A–72E and then out of chassis 70 through an exhaust port 78. Integrated circuits 80 mounted on circuit cards 72A–72E are fitted with air flow controlling thermal control devices 82 similar to thermal control device 50 of FIGS. 10–13. The spaces between circuit boards 72A–72E form channels through which cooling air 75 passes en route between inlet port 76 and outlet port 78. The vanes of thermal control devices 82 within each channel control the relative amount of cooling air 75 that passes through that channel. For example, as illustrated in FIG. 15, the ICs 80 mounted on circuit boards 72A and 72E generate more heat than those mounted on circuit board 72B. Therefore the vanes of thermal control devices 82 of circuit boards 72A and 72E, being warmer than the vanes of thermal control devices 82 of circuit board 72B–72D, allow a larger amount of cooling air to flow there through. ICs 80 of circuit board 72C generates relatively little heat and the vanes of its thermal control devices 82 pass only a little cooling air through the channel between board 72C and 72D. ICs 80 of circuit board 72B generate no heat and therefore the vanes of its thermal control devices 82 pass no cooling air through the channel between boards 72B and 72C.

The vanes of thermal control devices 82 of FIG. 15 not only help to limit the temperature range of ICs 80, they also act as a cooling air balancing system directing cooling air to the ICs 80 that most need it, thereby tending to keep all ICs at a relatively uniform temperature. The temperature range can be further limited by placing a temperature sensor 84 in outlet 78. Temperature sensor 84 provides an signal $V_{TEMP}$ of a magnitude proportional to the temperature of the outlet air as input to a differential amplifier 87. An adjustable reference voltage $V_{REF}$ is supplied to another input of amplifier 87. The output $V_{DIF}$ of amplifier 87, proportional to a difference between magnitudes of $V_{TEMP}$ and $V_{REF}$, is supplied as input to a conventional motor speed controller 86. Controller 86 increases the speed of fan 74 when the $V_{DIF}$ is positive ($V_{TEMP}$ greater than $V_{REF}$) and decreases the speed of FIG. 74 when $V_{DIF}$ is negative ($V_{TEMP}$ less than $V_{REF}$). Since the temperature of the air flowing through outlet 78 is proportional to the average temperature of ICs within chassis 70, the air flow rate control system holds the average IC temperature within a narrow range. The air flow balancing provided by the bi-metallic vanes of thermal control devices 82 together with the air flow rate control system cooperate to hold all ICs 80 at a relatively constant, uniform temperature. That uniform temperature can be selected by adjusting the magnitude of $V_{REF}$. Fan 74 can be replaced with an air pump. Although an air pump would reverse the direction of air flow through chassis 78, the cooling system would control IC temperature in a similar manner.

Thermal Control Device with Remote Air Valve

FIG. 17 illustrates a plan view and FIGS. 18 and 19 illustrate sectional elevation views of another embodiment of a thermal control device 88 in accordance with the present invention having an air valve 90 formed by a pair of bi-metallic vanes 92A and 92B, a heat conducting frame 94 having an opening 96, and a heat sink 98. Vanes 92A and 92B are attached at one end to frame 94 and are sized and positioned to fill opening 96 when they are cool and flat, thereby preventing air flow through opening 96. As vanes 92A and 92B warm up they bend to allow cooling air to flow through opening 96. Heat sink 98 is attached to a set of integrated circuits 100 mounted on a circuit board 102 inserted into an edge connector 104 on a motherboard 106. Heat sink 98 conducts heat from ICs 100 and dissipates it into cooling air passing over it. Heat sink 98 may be a solid heat conductor or a heat pipe. Although not shown in FIGS. 17–19, heat sink 98 may include cooling fins on its side opposite ICs 100.

Heat sink 98 is attached to frame 90 and delivers heat from ICs 100 into frame 94. Frame 94 in turn forwards the heat into vanes 92A and 92B. Thus as ICs 100 become increasingly warm, more heat flows to vanes 92A and 92B via heat sink 98 and frame 96 causing the vanes to warm up and bend increasingly inward to increase the flow of cooling air across heat sink 98.

FIG. 20 illustrates an alternative embodiment of the thermal control devices that is similar to device 88 of FIGS. 17–19 except that bi-metallic vanes 92A and 92B have been replaced with shutters 92C and 92D converting the opening 96 in frame 94. Shutters 92C and 92D move up or down with the expansion or contract of a pair of bi-metallic springs 92E and 92F linking shutters 92C and 92D to frame 94. Springs 92E and 93F contract as the IC temperature increases to move shutters 92C and 92D apart, thereby allowing more cooling air to flow through opening 96 of frame 94. Springs 92E and 93F expand as the IC temperature decreases to bring shutters 92C and 92D closer together, thereby allowing less cooling air to flow through opening 96.

FIG. 21 illustrates a sectional plan view of a chassis 108 holding a set of five circuit boards 110. ICs 111 on each circuit board are attached to a thermal control device 88 of the type illustrated in FIGS. 17–19. The frame 94 of each heat sink is installed in an opening in chassis 108. An air pump 112 draws air from chassis 112 through an outlet port 114. A controller 116 senses the air temperature in outlet port 114 and increases the speed of air pump 112 when the air temperature rises above a desired set point and decreases the speed of air pump out 112 when the outlet air temperature falls below the set point.

As pump 112 removes air from chassis 112 replacement air flows into chassis 108 through the openings in the frames of thermal control devices 88 and across their heat sinks 98. Each thermal control devices 88 independently regulate the amount of air flowing across its heat sink 98 in relation to the amount of heat produced by the ICs attached to the heat sink, so that all ICs are held within a narrow temperature range centered about the set point temperature determined by controller 116.

Thus has been shown and described alternative embodiments of a self-balancing thermal control device for an IC having bi-metallic fins or vanes which change shape with increasing temperature so as to increase the rate at which heat is removed from the IC as the IC warms. A self-balancing thermal control device in accordance with the invention restricts the operating temperature of the IC to a narrower range than a conventional heat sink. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A system for controlling temperature of a plurality of integrated circuit devices (ICs) mounted on a plurality of circuit boards, the system comprising:

a set of heat sinks, each attached to a separate one of said ICs and including at least one vane that changes shape as its becomes warmer, a chassis holding the printed circuit boards adjacent to one another thereby to form channels therebetween, said heat vanes extending into said channels, wherein said chassis includes an air inlet port for passing air into said chassis and an air outlet port for passing air out of said chassis, and means for forcing air through said inlet port such that said air flows through said channels and exits said chassis via said outlet port.

2. The system in accordance with claim 1 wherein as said said vane changes shape it substantially alters a flow rate of air through the channel into which said vane extends.

3. The system in accordance with claim 1 further comprising means for sensing a temperature of air in said chassis and controlling a rate at which said means for forcing air forces air through said inlet port so as to maintain the sensed temperature substantially constant.

4. The apparatus in accordance with claim 3 wherein said means for sensing a temperature of air in said chassis and controlling a rate at which said means for forcing air forces air through said inlet port so as to maintain the sensed temperature substantially constant comprises:

a shutter mounted on said chassis for partially restricting air flow through said inlet port, and thermomorphic material attached to said shutter and said chassis that changes shape as it warms thereby moving said shutter so as to permit substantially more air to flow through said input ports.

5. The system in accordance with claim 3 wherein as said said vane changes shape it substantially alters a flow rate of air through the channel into which said vane extends.

6. The system in accordance with claim 1 wherein said vane comprises:

a first layer of material, and a second layer of material bonded to said first layer, wherein said first layer of material and said second layer of material have differing coefficients of thermal expansion.

7. The apparatus in accordance with claim 6 wherein said first and second layers of material are metallic.

8. The system in accordance with claim 7 wherein as said said vane changes shape it substantially alters a flow rate of air through the channel into which said vane extends.

* * * * *